(12) United States Patent
Hah et al.

(10) Patent No.: US 10,860,760 B2
(45) Date of Patent: Dec. 8, 2020

(54) SYSTEMS AND METHODS FOR IMPLEMENTING LEARNED PARAMETER SYSTEMS ON A PROGRAMMABLE INTEGRATED CIRCUIT

(71) Applicant: Intel Corporation, Santa Clara, CA (US)

(72) Inventors: Thiam Khean Hah, San Jose, CA (US); Vamsi Nalluri, San Jose, CA (US); Herman Henry Schmit, San Jose, CA (US); Scott J. Weber, San Jose, CA (US); Randy Huang, Morgan Hill, CA (US)

(73) Assignee: Intel Corporation, Santa Clara, CA (US)

( * ) Notice: Subject to any disclaimer, the term of this patent is extended or adjusted under 35 U.S.C. 154(b) by 189 days.

(21) Appl. No.: 15/941,983

(22) Filed: Mar. 30, 2018

(65) Prior Publication Data

US 2018/0307783 A1 Oct. 25, 2018

Related U.S. Application Data

(60) Provisional application No. 62/488,629, filed on Apr. 21, 2017.

(51) Int. Cl.
*G06F 30/327* (2020.01)
*G06F 30/34* (2020.01)
(Continued)

(52) U.S. Cl.
CPC ............ *G06F 30/327* (2020.01); *G06F 30/34* (2020.01); *G06N 3/04* (2013.01); *G06N 3/0454* (2013.01);
(Continued)

(58) Field of Classification Search
USPC .......................................................... 716/103
See application file for complete search history.

(56) References Cited

U.S. PATENT DOCUMENTS

2018/0108263 A1\* 4/2018 Ramamurthi .......... G06N 3/006

OTHER PUBLICATIONS

Alex Krizhevsky, et al., "ImageNet Classification with Deep Convolutional Neural Networks," Advances in Neural Network Information Processing Systems 25(2), Jan. 2012, pp. 1-9.
(Continued)

*Primary Examiner* — Bryce M Aisaka
(74) *Attorney, Agent, or Firm* — Fletcher Yoder, P.C.

(57) ABSTRACT

Systems and methods are included for efficiently implementing learned parameter systems (LPSs) on a programmable integrated circuit (PIC) via a computing engine. The computing engine receives an input set of learned parameters corresponding to use instances of an LPS. The computing engine reduces at least some redundancies and/or unnecessary operations using instance specific parameter values of the LPS, to generate a less redundant set of learned parameters and a corresponding less redundant LPS. The computing engine generates a netlist based on these, which may share computing resources of the PIC across multiple computations in accordance with the less redundant set of learned parameters and the corresponding less redundant LPS. The computing engine then programs the PIC with the netlist. That is, the netlist replaces use instances of at least some of the original learned parameters and its corresponding LPS and is executed instead of the original.

21 Claims, 10 Drawing Sheets

(51) Int. Cl.
 *G06N 3/04* (2006.01)
 *G06N 3/063* (2006.01)
 *G06N 3/08* (2006.01)
(52) U.S. Cl.
 CPC ............. *G06N 3/0635* (2013.01); *G06N 3/08* (2013.01); *G06N 3/084* (2013.01)

(56) References Cited

OTHER PUBLICATIONS

Christian Szegedy, et al., "Going Deeper with Convolutions," arXiv:1409.4842, Sep. 17, 2014, pp. 1-9.
Matthieu Courbariaux, "BinaryConnect: Training Deep Neural Networks with Binary Weights during Propagations," arXiv:1511.00363, Nov. 2, 2015, pp. 1-9.
Zhouhan Lin, et al., "Neural Networks with Few Multiplications," arXiv:1510.03009, Oct. 11, 2015, pp. 1-9.
Intel Quartus Prime Design Software, pp. 1-10.
"ABC: A system for Sequential Synthesis and Verification, Berkley Logic Synthesis and Verification Group," https://people.eecs.berkeley.edu/~alanmi/abc/, Sep. 20, 2012, p. 1.
Ujjwal Karn, "A Quick Introduction to Neural Networks," https://ujjwalkarn.me/2016/08/09/quick-intro-neural-networks/, Aug. 9, 2016, pp. 1-11.
Ujjwal Karn, "An Intuitive Explanation of Convolutional Neural Networks," https://ujjwalkarn.me/2016/08/11/intuitive-explanation-convnets/, Aug. 11, 2016, pp. 1-16.
Andrej Karpathy, "CS231n Convolutional Neural Networks for Visual Recognition," http://cs231n.github.io/convolutional-networks/, Aug. 2017, pp. 1-23.

* cited by examiner

SYSTEMS AND METHODS FOR IMPLEMENTING LEARNED PARAMETER SYSTEMS ON A PROGRAMMABLE INTEGRATED CIRCUIT

CROSS REFERENCE TO RELATED APPLICATIONS

This application claims priority to U.S. Provisional Application Ser. No. 62/488,629, filed Apr. 21, 2017, entitled "Convolution Neural Network Formulation Systems and Methods," which is hereby incorporated by reference in its entirety for all purposes.

BACKGROUND

This disclosure relates to systems and methods for implementing learned parameter systems on programmable integrated circuits.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Learned parameter systems include systems that learn and/or adjust values associated with parameters in a training or tuning phase, and then apply the learned values (which do not change or change very slowly and/or rarely and thus may be referred to as "stable") in a use phase. References to training phases should be understood to include tuning phases, as well as any other suitable phases that adjust the values to become more suited to perform a desired function, such as retraining phases, fine-tuning phases, search phases, exploring phases, or the like. A use instance of a learned parameter system and/or its parameters is an instance of the same that has stable parameter values and may be employed in the use phase of the learned parameter system. For example, learned parameter systems may include Deep Learning systems, Deep Neural Networks, Neuromorphic systems, Spiking Networks, and the like.

For example, a Convolutional Neural Network (CNN) is a type of a learned parameter system, which may perform convolutions of input feature maps of an image with a set of learned parameters (also referred to as filter matrices or weights) to generate output feature maps. The CNN may perform many convolutions using many input feature maps and many learned parameters, generating many output feature maps. Each generated output feature map may, in turn, be an input feature map for another convolution. As such, a CNN computation could involve performing an enormous number of computations and/or operations, thus using a large amount of energy, power, processing power, memory, storage, and the like. The learned parameter system may be trained or tuned to more accurately recognize images by adjusting the learned parameters as the learned parameter system is used to attempt image recognition repeatedly over time. These learned parameters may then be used, for example, to recognize and/or classify the image.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
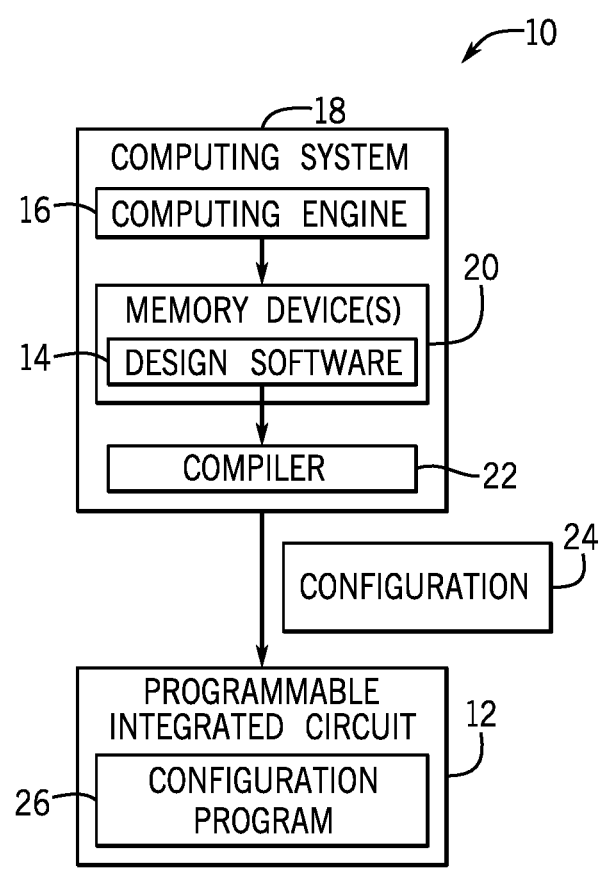
FIG. 1 is a block diagram of a system that may decrease redundancy in implementing learned parameter systems, such as a convolutional neural network (CNN), in a programmable integrated circuit, according to an embodiment of the present disclosure.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

The use of the singular or plural linguistic constructs does not exclude applicability of the other, such that, "program" may include "programs," and vice versa. The use of the singular and/or plural linguistic constructs also does not exclude sets and/or collections, and vice versa, such that a "learned parameter system" or "programmable integrated circuit" may include "set(s)" of "learned parameter systems" or "programmable integrated circuit," respectively. This may include sets or collections of zero, one and/or more elements.

Learned parameter systems include systems that learn and/or adjust values associated with parameters in a training or tuning phase, and then apply the learned values (which do not change or change very slowly and/or rarely and thus may be referred to as "stable") in a use phase. References to training phases should be understood to include tuning phases, as well as any other suitable phases that adjust the values to become more suited to perform a desired function, such as retraining phases, fine-tuning phases, search phases, exploring phases, or the like. For example, learned parameter systems may include Deep Learning systems, Deep Neural Networks, Neuromorphic systems, Spiking Networks, and the like. A use instance of a learned parameter system and/or its parameters is an instance of the same that has stable parameter values and may be employed in the use phase of the learned parameter system.

As an applicable example, Convolutional Neural Networks (CNNs) are a category of Deep Neural Networks that have proven effective in areas such as image recognition and classification. Deep Neural Networks are computational models inspired by the way biological neural networks in the human brain process information. Using image recognition as an example, a CNN may perform convolutions of input feature maps of an image with a set of learned parameters (also referred to as filter matrices or weights) to generate output feature maps. The CNN may be trained or tuned to more accurately recognize images by adjusting the learned parameters as the CNN is used to attempt image recognition repeatedly over time. These output feature maps may then be used, for example, to recognize and/or classify the image. A CNN may perform many convolutions using many input feature maps and many learned parameters, and each generated output feature map may, in turn, be an input feature map for another convolution. As such, CNN computation could involve performing an enormous number of computations and/or operations, thus using a large amount of energy, power, processing power, memory, storage, and the like.

It should be understood that while the present disclosure uses the CNN as an applicable example of a learned network system, use of the CNN as an example is meant to be non-limiting, and the present disclosure may apply to any suitable learned parameter system (e.g., any other Deep Neural Network, Deep Learning system, Neuromorphic system, Spiking Network, and the like). More particularly, the present disclosure uses two-dimensional CNN convolution as an applicable example. However, it should be understood that the present disclosure may apply to any suitable number of dimensional convolution (e.g., N-dimensional convolution), and should not be limited specifically to two-dimensional convolution.

With the foregoing in mind, FIG. 1 is a block diagram of a system 10 that may decrease redundancy in implementing learned parameter systems, such as a CNN, in a programmable and/or reconfigurable integrated circuit 12, according to an embodiment of the present disclosure. The redundancy may include, but may not be limited to, inter and/or intra operation duplication, in part or in whole, and/or trivial or unnecessary operations. An operation may be unnecessary if its output does not depend on the input, is trivially related or can be trivially combined with another operation, or the like. For example, an unnecessary operation may include, but is not limited to, an identify function, combining a multiplication function with −1 and an addition function into a single subtraction function, or the like. Some operations that are trivial in one programmable integrated circuit 12 may not be unnecessary on other programmable integrated circuit 12.

The programmable integrated circuit 12 may include one or more programmable logic devices, field programmable gate arrays (FPGAs), coarse grain arrays of computation engines, fine grain arrays of computing engines with arbitrary interconnects, FPGA overlays, or the like. A user may implement a circuit design to be programmed onto the programmable integrated circuit 12 using design software 14, such as a version of Quartus by Intel Corporation.

The design software 14 may be executed by a computing engine 16 of a computing system 18. The computing system 18 may include any suitable device capable of executing the design software 14, such as a desktop computer, a laptop, a mobile electronic device, a server, and the like. The computing system 18 may access, configure, and/or communicate with the programmable integrated circuit 12. The computing engine 16 may include any suitable components, circuitry, or logic, that may execute machine-readable and/or processor-executable instructions (e.g., firmware or software), such as instructions to analyze and/or recognize an image and/or portions of the image using a CNN. For example, the computing engine 16 may include one or more processors (e.g., multiple microprocessors), one or more other integrated circuits (e.g., application specific integrated circuits, field programmable gate arrays, reduced instruction set processors, and the like), an array of multipliers and/or logic devices, or some combination thereof. The computing engine may include any device or collection of devices used for computation and information processing, such as, but not limited to, one or more central processing units, graphics processing units, vector engines, programmable logic devices, neural processors, neuromorphic engines, quantum computers, and the like. This may also include a device or collection of devices having, in part or in whole, one or more instances of such computing engines. Such a collection of devices may or may not be homogenous.

One or more memory devices 20 may store the design software 14. In addition, the memory device(s) 20 may store information related to the programmable integrated circuit 12, such as control software, configuration software, look up tables, configuration data, etc. In some embodiments, the computing engine 16 and/or the memory device(s) 20 may be external to the computing system 18. The memory device(s) 20 may include a tangible, non-transitory, machine-readable-medium, such as a volatile memory (e.g., a random access memory (RAM)) and/or a nonvolatile memory (e.g., a read-only memory (ROM)).

The memory device(s) 20 may store a variety of information and be used for various purposes. For example, the memory device(s) 20 may the store machine-readable and/or processor-executable instructions (e.g., firmware or software) for the computing engine 16 to execute, such as instructions to analyze and/or recognize an image and/or portions of the image using a CNN. The memory device(s) 20 may include one or more storage devices (e.g., nonvolatile storage devices) that may include read-only memory (ROM), flash memory, a hard drive, or any other suitable optical, magnetic, or solid-state storage medium, or any combination thereof.

The design software 14 may use a compiler 22 to generate a low-level circuit-design configuration 24 for the programmable integrated circuit 12. The configuration 24 may include a number of formats, such as a program object file, bitstream, or any other suitable format which may configure the programmable integrated circuit 12. That is, the compiler 22 may provide machine-readable instructions representative of the circuit design to the programmable integrated circuit 12. For example, the programmable integrated circuit 12 may receive one or more configurations 24 that describe hardware configurations that implement a CNN in the programmable integrated circuit 12. In the present disclosure, configuration and program and may be used interchangeably to refer to one another. Moreover, derivatives of configuration and program, such as, but not limited to, programming and configuring, programmable and configurable, and the like, may likewise be used interchangeably to refer to one another. In some embodiments, the configuration 24 may be programmed into the programmable integrated circuit 12 as a configuration program 26. In particular, a trained or tuned CNN may be programmed in the programmable integrated circuit 12. The trained or tuned CNN may, for example, include learned parameters that have been tuned by running the CNN repeatedly over time to more accurately recognize images. References to a trained network (e.g., the CNN) or system should be understood to include a tuned network or system, as well as any other suitable network or system that adjusts values to become more suited to perform a desired function, such as a retrained network or system, a fine-tuned network or system, a search network or system, an exploring network or system, or the like.

Figure 2:
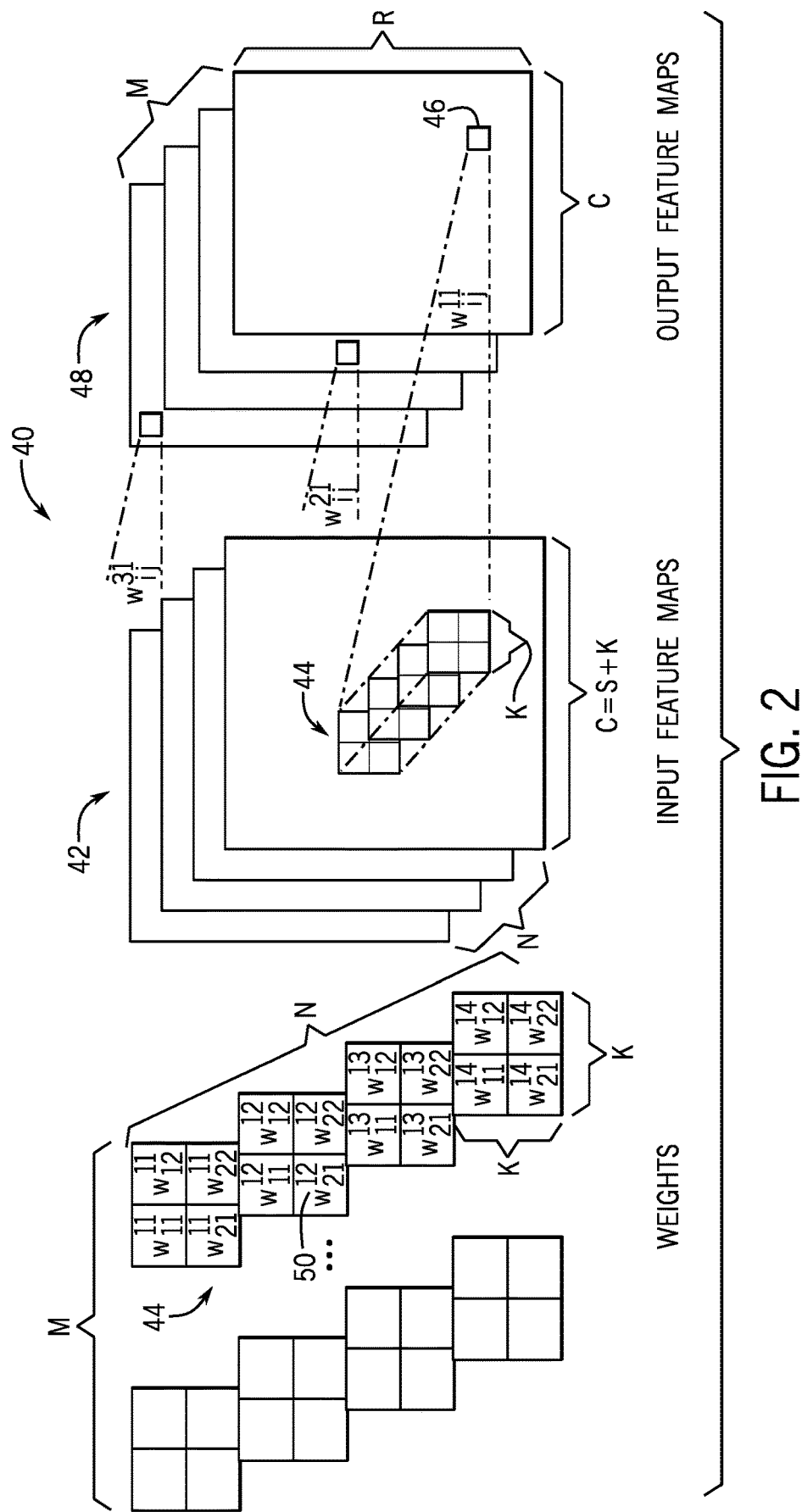
FIG. 2 is a diagram of a convolution layer of a CNN that may be programmed into the programmable integrated circuit of FIG. 1, according to an embodiment of the present disclosure.

FIG. 2 is a diagram of a convolution layer 40 of a CNN that may be programmed into the programmable integrated circuit 12 of FIG. 1, according to an embodiment of the present disclosure. As illustrated, each convolution layer 40 may convolve a set of N input feature maps 42 with M sets of N K×K learned parameters (also referred to as filter matrices or weights 44). Each weight 44 may include kernels (K×K) and be previously determined through a learning algorithm, such as back propagation. The convolution may be performed by sliding the weight 44 across the input feature map 42 in two dimensions with a stride of S (where the weight 44 is moved S locations per step). At each location that the weight 44 is moved, the weight's values may be multiplied with overlapping values of the input feature map 42, and the resulting products may be summed together and inserted into an output feature map 48 as an output value 46. As illustrated, the output feature map 48 include R rows and C columns. This process may be repeated for each of the M sets of weights 44, with each repetition generating an output feature map 48. An example of pseudo-code outlining the structure of the convolution layer 40 is described below:

```
for(row=0; row<R; row++) {
  for(col=0; col<C; col++) {
    for(to=0; to<M; to++) {
      for(ti=0; ti<N; ti++) {
        for(i=0; i<K; i++) {
          for(j=0; j<K; j++) {
L:          output_fm[to][row][col] +=
              weights[to][ti][i][j]*
              input_fm[ti][S*row+i][S*col+j];
}}}}}}
```

It should be understood that, while the convolution layer 40 illustrates M=4 sets of weights 44 and output feature maps 48, any suitable number of M (e.g., 1-1000000) sets of weights 44 and output feature maps 48 is contemplated. Similarly, it should be understood that, while the convolution layer 40 illustrates N=4 weights 44 per set and input feature maps 42, any suitable number of N (e.g., 1-1000000) weights 44 per set and input feature maps 42 is contemplated. Furthermore, while the convolution layer 40 illustrates K×K=2×2 weights 44, it should be understood that any suitable dimension (e.g., 1×1-1000×1000) of weights 44 is also contemplated. Moreover, the in some embodiments, the convolution layer 40 may have K×J weights 44, where K may not be equal to J.

In some embodiments, one or more bias values may be added to teach of the M output feature maps. The output feature maps 48 may also undergo one or more non-linear operations and/or subsampling operations (e.g., pooling). A CNN may include any suitable number (e.g., 1-1000) of convolution layers 40, with output feature maps 48 of a preceding convolution layer 40 being used as input feature maps 42 of a subsequent convolution layer 40.

The weights 44 may include values 50 that may be expressed in a number of formats. For example, the values 50 may be floating point numbers (e.g., 32 bit floating point numbers), integers (e.g., INT6 integers), or the like. In some embodiments, the weights 44 may be ternary, such that the values 50 of the weights 44 may be one of three possible arbitrary values (such as −1, 0, and 1). In some embodiments, the weights 44 may be binary, such that the values 50 of the weights 44 may be one of three possible arbitrary values (such as −1 and 1). In additional or alternative embodiments, the weights 44 may be transformed to a different format, such as a different numerical format. The transformation may result in exact or approximate values of the weights 44. For example, the weights 44 may be quantized to a different format. In such an example, the weights 44 may initially be in floating point format, but be quantized to ternary or binary weights (e.g., to reduce processing time and/or memory space usage). In some embodiments, the values of the weights 44 may be transformed to a set of scaled ternary numbers, such as unsigned eight bit integers (UINT8 11111=1*2^6−1). This may enable ternary redundancy for other number formats.

The present disclosure discusses, in further detail below, reducing redundancies in the convolution layer 40, specifically by reducing redundancies in the weights 44. As such, programming the weights 44 in the convolution layer 40 includes programming a representation of these less redundant weights 44 into the programmable integrated circuit 12.

Figure 3:
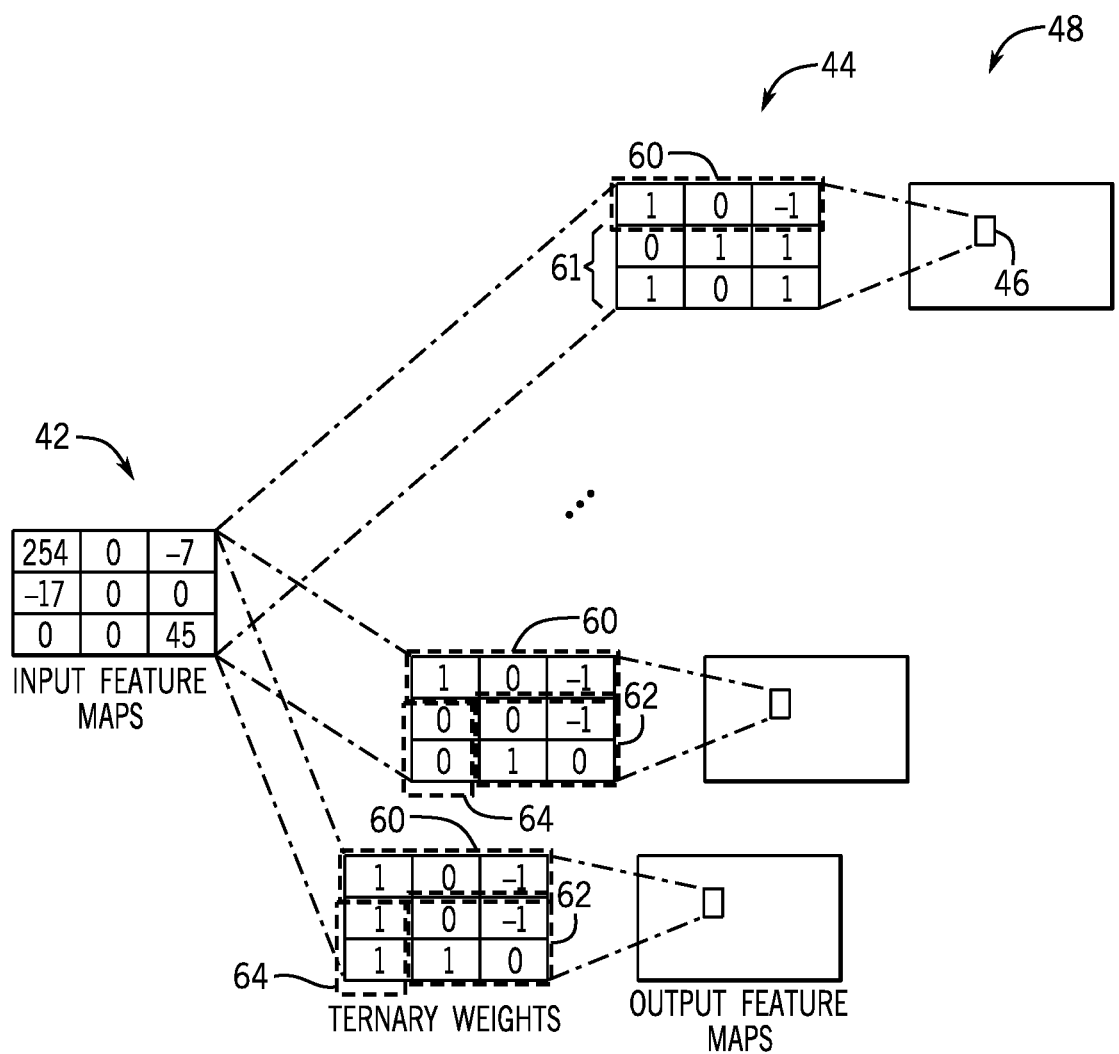
FIG. 3 is an example diagram of applying ternary weights to an input feature map in a convolution layer, according to an embodiment of the present disclosure.

FIG. 3 is a diagram of an example of applying ternary weights 44 to an input feature map 42 in a convolution layer 40, according to an embodiment of the present disclosure. In particular, FIG. 3 provides an example of reducing at least some redundancies and/or unnecessary operations using stable and known use instance specific parameter values of a learned parameter system having the ternary weights 44, to generate a less redundant set of ternary weights and a corresponding less redundant learned parameter system. Since the values of the instance specific parameters are known and stable, redundancies may be statically identified. As illustrated in the example diagram of FIG. 3, the top row 60 of each ternary weight 44 is identical (having values of 1, 0, and −1). As such, applying the top row 60 of each ternary weight 44 to the input feature map 42 will result in the same values (e.g., 254*1+0*0+(−7)*(−1)=231). That is, the same calculation may be performed multiple times due to redundancy in the weights 44. Instead, the programmable integrated circuit 12 may be programmed to perform this calculation once, combine the result with any remaining calculations of a respective convolution, and then send the result 46 to the three output feature maps 48 associated with the three ternary weights 44. The top row 60, then, may be referred to as a set of redundant values with respect to the three ternary weights 44 of FIG. 3. The remaining values of the three ternary weights 44 (e.g., the second and third rows 61 may be referred to as a set of non-redundant values with respect to the three ternary weights 44.

Additionally, a bottom right 2×2 portion 62 of the bottom two ternary weights 44 is also identical (having values of 0, −1, 1, and 0). Applying the bottom right 2×2 portion 62 of each ternary weight 44 to the input feature map 42 will result in the same values (e.g., 0*0+0*(−1)+0*1+45*0=0). Again, the same calculation may be performed multiple times due to redundancy in the weights 44. Instead, the programmable integrated circuit 12 may be programmed to perform this calculation once, combine the result with any remaining calculations of a respective convolution, and then send the result 46 to the bottom two output feature maps 48 associated with the bottom two ternary weights 44. As such the values of the top row 60 and the bottom right 2×2 portion 62 may be the set of redundant values with respect to the bottom two ternary weights 44, and the remaining values 64 may be the set of non-redundant values. Because CNNs may include performing many convolutions using many weights, and each generated output feature map may in turn be an input feature map for another convolution, decreasing redundancy in implementing CNNs in this manner may result in saving processing time and/or memory space usage.

It should be understood that reference to a set of non-redundant values in the present disclosure refers to the set of values of one or more weights that do not include the identified set of redundant values, and, as such, the set non-redundant values may still include some form of redundancy (e.g., some values may still be redundant between two or more weights that are included in each weight's set of non-redundant values). Correspondingly, while the set of redundant values between two or more weights includes values that are in common positions between the two or more weights, it should be understood that the set of redundant values may not include every redundant value between the two or more weights (e.g., every value that is in a common position between the two or more weights). While the set of redundant values may include every redundant value between the two or more weights, in some cases, there may be redundant values that are not included in the set of redundant values. For example, in some cases, some redundant values may not be found or remain undiscovered. In other cases, the redundant values may be found, but a user or the configuration 24 may not select these redundant values to be included in the set of redundant values (for reasons related to convenience of implementation, less complexity, less processing, or the like).

Additionally, because applying (e.g., multiplying) a ternary weight having a zero value to an input feature map generates a zero value in a corresponding position of the output feature map, this calculation may be ignored or not performed. As such, a reconfigurable integrated circuit device programmed to implement a CNN that has a weight having a zero value in its matrix may be further programmed to ignore or not perform a respective calculation associated with or corresponding to the zero value. For example, the configuration 24 and/or a netlist programmed to the programmable integrated circuit 12 may not connect one or more wires in the programmable integrated circuit 12 corresponding to the zero value such that the respective calculation may be ignored or not performed. Mapping these computations to skip or ignore zero values to the configuration 24 and/or the netlist to be programmed to the programmable integrated circuit 12 may naturally extract the benefit of sparsity and zero out these computations with perfect efficiency and zero overhead (e.g., when compared to conventional zero skipping techniques). In this manner, the netlist may share computing resources of the programmable integrated circuit 12 across multiple computations in accordance with a less redundant set of learned parameters and the corresponding less redundant learned parameter system. That is, the netlist replaces use instances of at least some of the original ternary weights 44 and their corresponding learned parameter system.

While the present disclosure illustrates reducing redundancies in ternary weights, it should be understood that the ternary weights are used as a non-limiting example. It is contemplated that the present disclosure may apply to any suitable form of learned parameters and their corresponding learned parameter system (that is, the learned parameter system using the learned parameters, including weights in binary format, floating point format, integer format, or the like.

Figure 4:
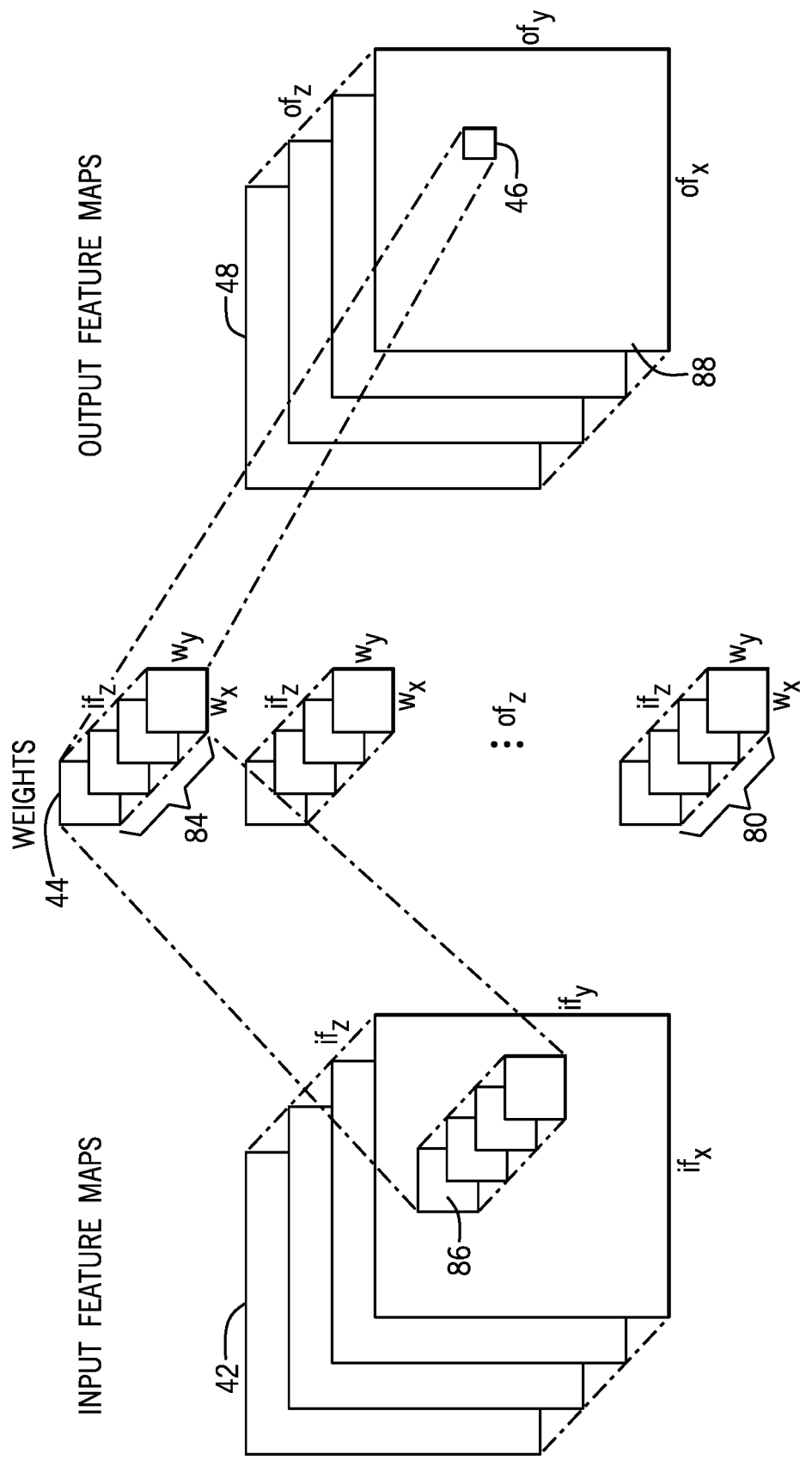
FIG. 4 is a diagram illustrating generating a value of an output feature map, according to an embodiment of the present disclosure.

Transposing the convolution may clarify or facilitate understanding of how the convolution is performed. FIG. 4 is a diagram illustrating generating a value of an output feature map, according to an embodiment of the present disclosure. As illustrated, there may be $if_z$ (e.g., corresponding to an input feature map depth along a z-axis of input feature maps 42) number of input feature maps 42. Each input feature map 42 may have $if_x$ (e.g., along an x-axis of the input feature map 42) number of columns and $if_y$ (e.g., along a y-axis of the input feature map 42) number of rows of values. There may also be $of_z$ (e.g., corresponding to an output feature map depth along a z-axis of output feature maps 48) number of output feature maps 48. The output feature maps 48 may be generated by two-dimensional convolution. Each output feature map 48 may have $of_x$ (e.g., along an x-axis of the output feature map 48) number of columns and $of_y$ (e.g., along a y-axis of the output feature map 48) number of rows of output values 46. There may be $of_z$ sets 80 of weights 44, and $if_z$ number (or depth) of weights 44 per set 80. Each weight may have $w_x$ (e.g., along an x-axis of the weight 44) number of columns and $w_y$ (e.g., along a y-axis of the weight 44) number of rows of values. Each output value 46 of an output feature map 88 may be determined as a sum of products (based on a set of input values 86 and a set 84 of weights 44) as described in the following equation:

$$y_{i,j}^k = \sum_{l=0}^{if_z} \sum_{n=j-1}^{j+1} \sum_{m=i-1}^{i+1} w_{m,n}^{k,l} \times x_{m,n}^l \quad (1)$$

Figure 5:
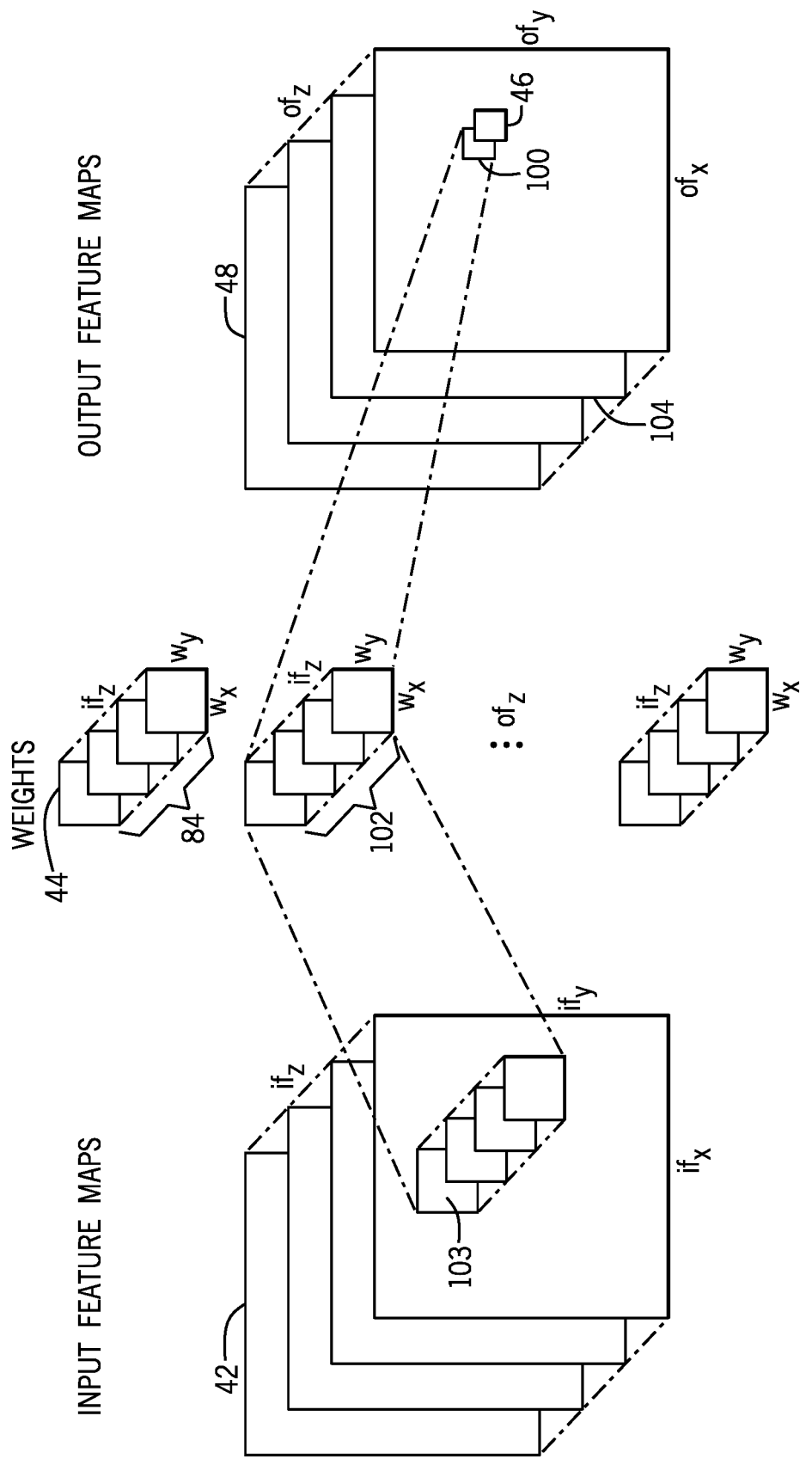
FIG. 5 is a diagram illustrating generating a value of another output feature map, according to an embodiment of the present disclosure.

FIG. 5 is a diagram illustrating generating a value of another output feature map, according to an embodiment of the present disclosure. As with FIG. 4, the output feature maps 48 may be generated by two-dimensional convolution. Each output value 100 of another feature map 104 may be determined as a sum of products (based on a set of input values 103 and a set 102 of weights 44) as described in the Equation 1 above.

Figure 6:
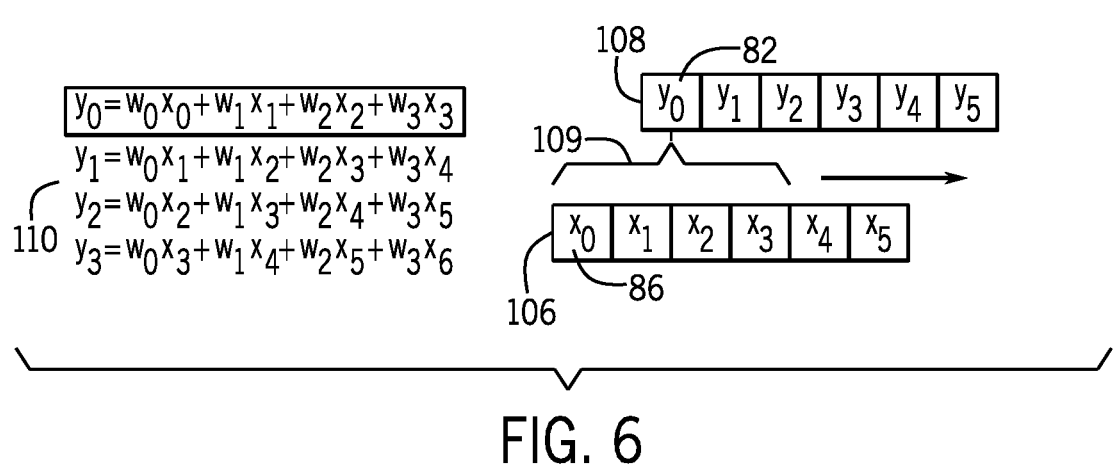
FIG. 6 is a diagram illustrating a linear convolution example relationship between input values and output values, according to an embodiment of the present disclosure.

FIG. 6 is a diagram illustrating a linear convolution example relationship between input values and output values, according to an embodiment of the present disclosure. An input line buffer 106 of input values (e.g., 86 of FIG. 4) of input feature maps 42 may be used to generate an output line buffer 108 of output values (e.g., 46 of FIG. 4). For example, a set of weights (e.g., 84 of FIG. 4) may be applied to a set of input values 109 to generate the output value 46. Example output values may be expressed as shown in the accompanying equations 110. As illustrated in the equations 110, each weight and input value is multiplied separately.

Figure 7:
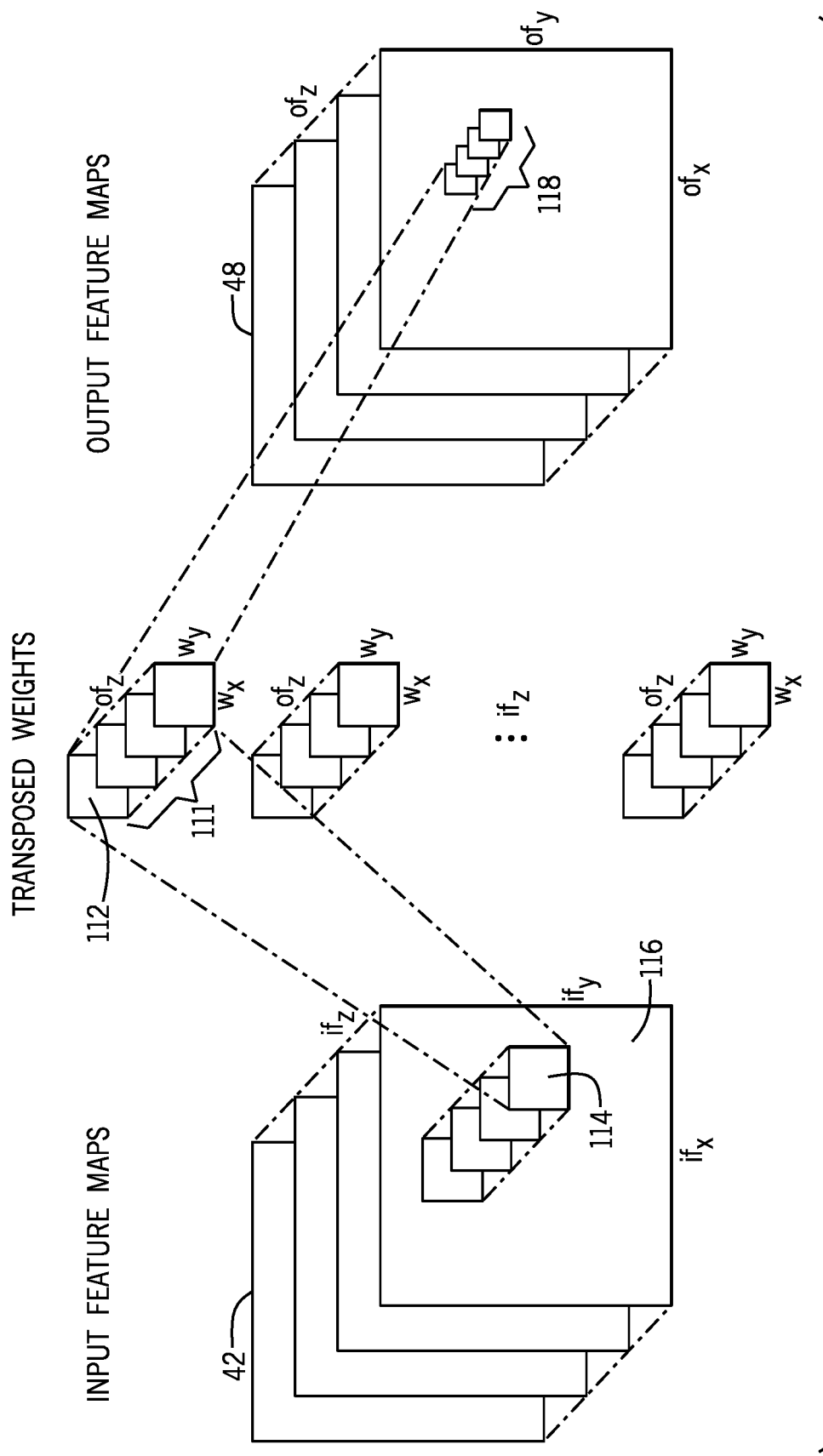
FIG. 7 is a diagram illustrating computing partial terms for output feature maps in parallel using a set of transposed weights, according to an embodiment of the present disclosure.

FIG. 7 is a diagram illustrating computing partial terms for output feature maps in parallel using a set of transposed weights based on a set of input values 114 for an input feature map 116, according to an embodiment of the present disclosure. In particular, the of$_z$ sets 80 of if$_z$ weights 44 may be transposed into if$_z$ sets 111 of of$_z$ weights 112 (which may be referred to as transposed weights 112). A partial term of output values 118 may be determined as a sum of products (based on a set of input values 114 and a set 111 of transposed weights 112) as described in the first two summations (corresponding to m and n in Equation 1 above). The final term of the output values 118 may be determined by adding all the partial terms of the output values 118 from all the input feature maps 42 sharing the same position (in the input feature maps 42). All partial term of output values for output feature maps 48 may be generated by 2 dimensional convolution.

Figure 8:
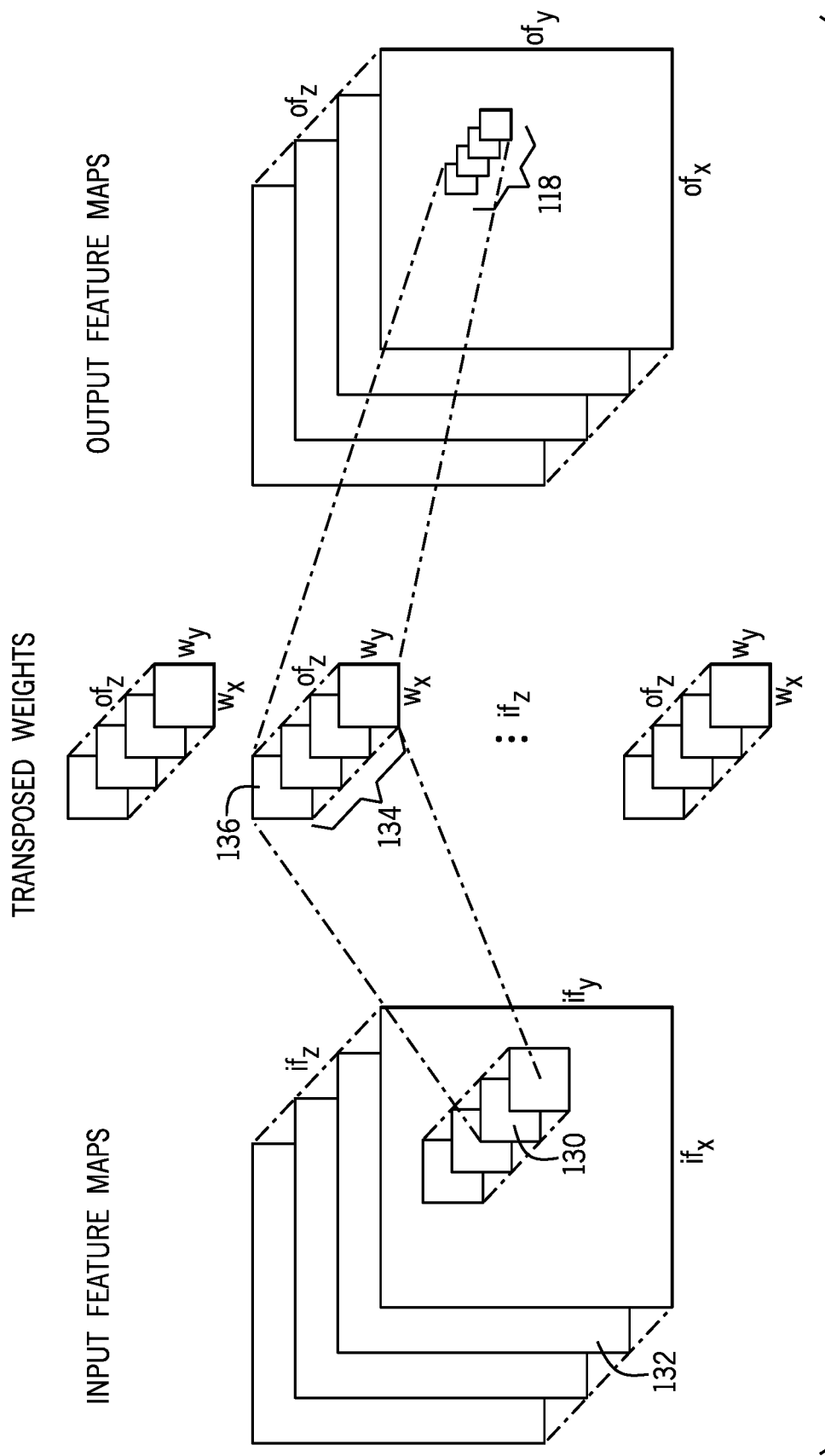
FIG. 8 is a diagram illustrating computing other partial terms for output feature maps in parallel using another set of transposed weights, according to an embodiment of the present disclosure.

FIG. 8 is a diagram illustrating computing another partial terms for output feature maps in parallel using another set of transposed weights based on a set of input values 130 for an input feature map 132, according to an embodiment of the present disclosure. As illustrated, partial terms of output values 118 of the output feature maps 48 may be determined as a sum of products (based on a set of input values 130 and a set 134 of transposed weights 136) as described in the first two summations (corresponding to m and n in Equation 1 above). The final term of the output values 118 may be determined by adding all the partial terms of the output values 118 from all the input feature maps 42 sharing the same position (in the input feature maps 42).

Figure 9:
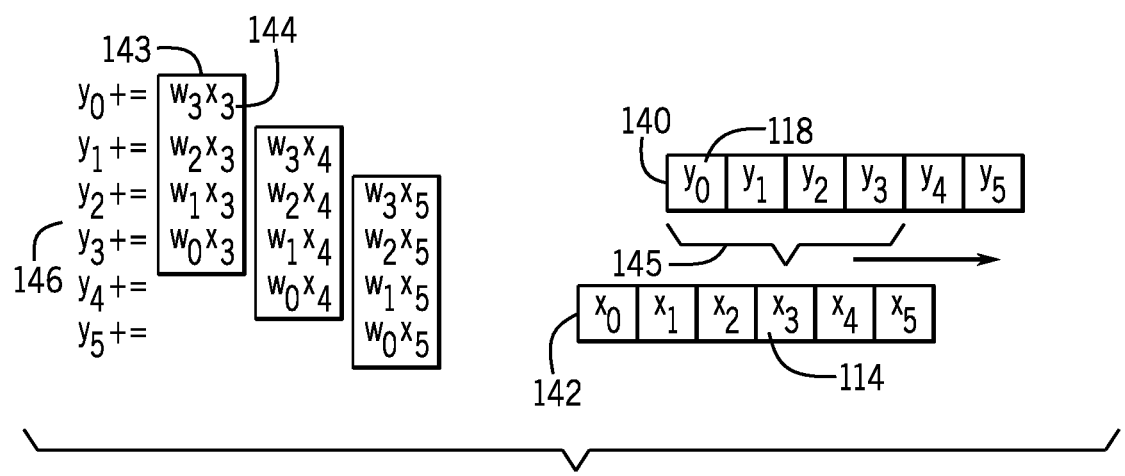
FIG. 9 is a diagram illustrating a transposed linear convolution example relationship between output values and input values, according to an embodiment of the present disclosure.

FIG. 9 is a diagram illustrating a transposed linear convolution example relationship between output values and input values, according to an embodiment of the present disclosure. An input line buffer 142 of input values (e.g., 114 of FIG. 7) may be used to generate an output line buffer 140 of output values (e.g., 118 of FIG. 7) of output feature maps 48, one partial term of an output value at a time. In particular, a set of transposed weights (e.g., 111 of FIG. 7) may be applied to each input value (e.g., 114) to generate a set 143 of partial output terms 144 corresponding to a set 145 of output values 118. Each set 143 of partial output terms 144 may thus be grouped by the same input value 114 and executed concurrently. As such, the output values 118 may be computed in an input-centric manner using common factor matrix multiplication.

Figure 10:
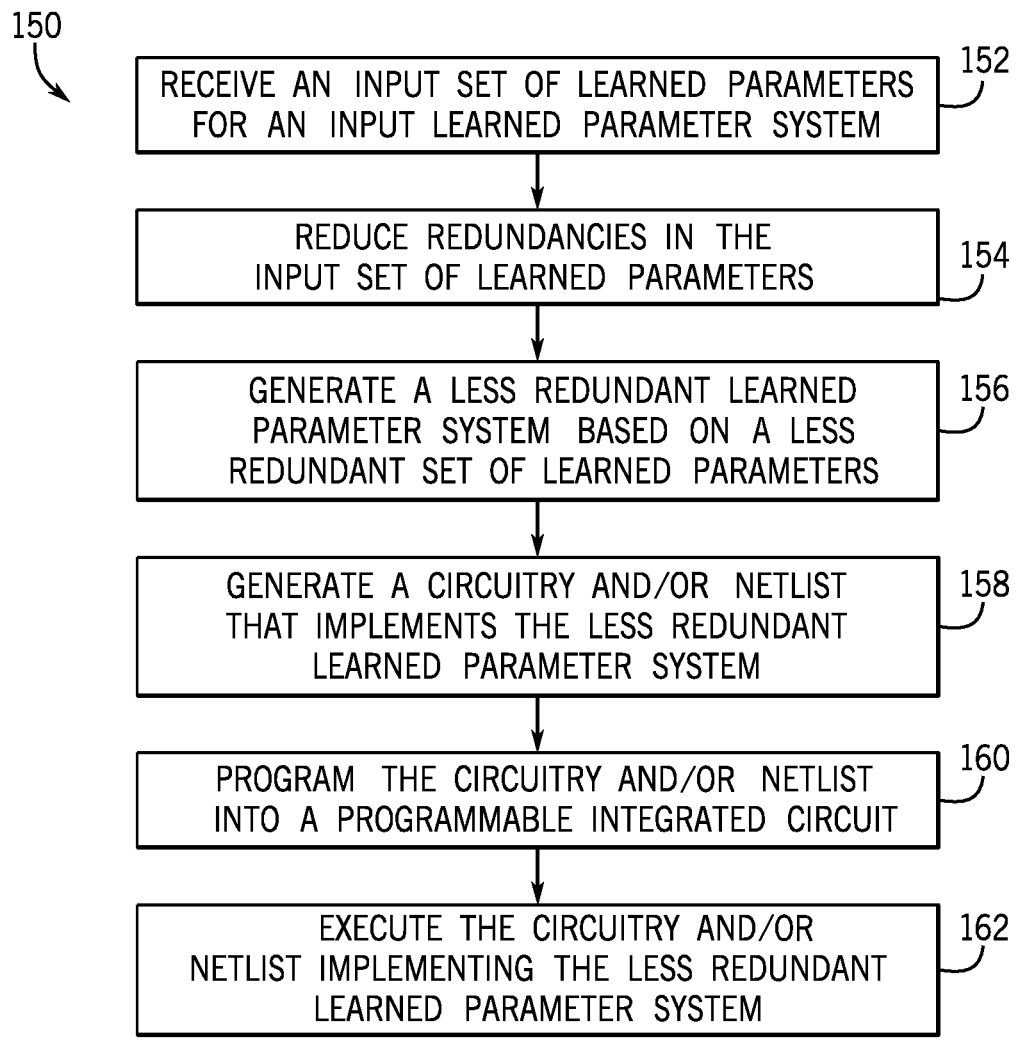
FIG. 10 is a flow diagram of a method for decreasing redundancies in a trained convolutional neural network, according to an embodiment of the present disclosure.

FIG. 10 is a flow diagram of a method 150 for reducing at least some redundancies and/or unnecessary operations in a learned parameter system to generate a less redundant set of learned parameters and a corresponding less redundant learned parameter system, according to an embodiment of the present disclosure. In particular, the values of use instance specific parameters of learned parameter systems are stable and known. This allows redundant learned parameter values and operations to be identified statically. Learned parameter values and operations associated with redundancies so identified may be reduced by sharing of the learned parameter values and operations. It should be understood that the method 150 may reduce at least some redundancies in the learned parameter system, in some cases, at least some redundancies may still remain (e.g., in the generated less redundant set of learned parameters and corresponding less redundant learned parameter system).

The method 150 may be performed by any suitable device or combination of devices that may reduce redundancies in an input set of learned parameters of a learned parameter system to generate a less redundant set of learned parameters of a less redundant learned parameter system, generate a netlist based on the less redundant learned parameter system, program the netlist into a programmable integrated circuit, and execute the netlist implementing the less redundant learned parameter system. While the method 150 is described in a specific sequence, it should be understood that the present disclosure contemplates that portions of the method 150 may be performed in different sequences than the sequence illustrated, and certain described portions may be skipped or not performed altogether. In some embodiments, at least some portions of the method 150 may be implemented by a computing engine, such as the computing engine 16. In alternative or additional embodiments, at least portions of the method 150 may be implemented by design software that programs the programmable integrated circuit 12, such as the design software 14, a configuration used to configure a programmable integrated circuit, such as the configuration 24, or the programmed integrated circuit, such as the programmable integrated circuit 12.

The computing engine 16 may receive (process block 152) an input set of learned parameters for an input learned parameter system. Each learned parameter may be previously determined through a learning algorithm, such as back propagation. That is, each learned parameter may be trained or tuned repeatedly over time, and thus may be have use instances or values that are stable or fixed (e.g., unchanging). In some embodiments, the computing engine 16 may quantize the set of learned parameters to generate a set of quantized learned parameters. For example, the set of learned parameters may be in an initial format, such as floating point numbers (e.g., 32 bit floating point numbers), integers (e.g., INT6 integers), or the like. The set of learned parameters may then be quantized into a different (target) format. That is, the set of learned parameters may initially be in floating point format, and the computing engine 16 may generate the set of learned parameters, which may be binary, ternary, or the like (e.g., to reduce processing time and/or memory space usage). In some embodiments, the set of weights may already be in the target format (e.g., ternary or binary learned parameters).

In an alternative embodiment, performing quantization, numerical format transformation, redundancy extraction, and the like, on the set of learned parameters, may produce a result that is an approximation of, but may not be mathematically equivalent to, the original input learned parameter system. While this may reduce quality in the result, it may allow for more efficient execution. Care is taken to ensure that a desired tradeoff of quality of results compared to efficiency is achieved.

The computing engine 16 may then reduce (process block 154) redundancies in the input set of learned parameters to generate a less redundant set of learned parameters. The redundancies may relate to instance specific parameter values of the learned parameter values and/or unnecessary operations related to the instance specific parameter values. For example, as illustrated in FIG. 3, the two bottom weights 44 each include a set of redundant values in the top row 60 and/or the bottom right 2×2 portion 62. In some instances, the input set of learned parameters may be transformed to facilitate identification of redundancies. For example, FIGS. 7-9 illustrate transposing weights 44 of a CNN and generating the output values 118 by computing the partial terms 144 of the output values 118 using the transposed weights 112, 136.

As mentioned previously, in some embodiments, the redundancies that may be reduced in process block 154 may not include every redundant value of the relevant learned parameters. For example, in FIG. 3, the set of redundant values to be reduced may include the top row 60, but not the bottom right 2×2 portion 62. As illustrated in FIG. 3, for example, the top row 60 of redundant values is also shared by the weight 44. In any case, the redundancies in the input set of learned parameters may be reduced by the computing engine 16, resulting in the less redundant set of learned parameters. If the redundancies are not reduced to generate the less redundant set of learned parameters as described in process 154, then the redundancies remain in the input set of learned parameters for the input learned parameter system, and there may be no realization of greater efficiency for redundancies that are not reduced.

The computing engine 16 may then generate (process block 156) a less redundant learned parameter system based on the less redundant set of learned parameters. In particular, because at least some redundancies have been reduced in the less redundant learned parameter system from the input learned parameter system, the less redundant learned parameter system may be more efficient The computing engine 16 may generate (process block 158) a circuitry and/or netlist based on the less redundant learned parameter system (and the associated less redundant learned parameters). The circuitry may be a circuit design describing how functional blocks in the programmable integrated circuit 12 are to be connected and programmed. Similarly, the netlist may be a graph, map, or other topography that describes connectivity and functionality of each node in the graph of a programmable integrated circuit, such as the programmable integrated circuit 12. For example, the netlist may list functional blocks and their configuration in the programmable integrated circuit 12 and list nodes the functional blocks are connected to. The netlist may be described in the configuration 24. In particular, the computing engine 16 may convert the less redundant learned parameter system (and the associated less redundant learned parameters) to the netlist.

In some embodiments, the redundant portion of the input learned parameter system may be represented in the circuitry and/or netlist once (e.g., in one instance). As such, at least some of the learned parameters represented in the circuitry and/or netlist may be reduced in size. In this manner, redundancy in implementing learned parameter systems may be decreased, resulting in decreased processing time, memory space usage, reduced power consumption, and/or greater efficiency Because applying (e.g., multiplying) a learned parameter having a zero value to an input feature map generates a zero value in a corresponding position of the output feature map, the computing engine 16 may generate the circuitry and/or netlist such that it configures the programmable integrated circuit 12 to ignore or not perform a respective calculation associated with or corresponding to the zero value. For example, the circuitry and/or netlist may not connect one or more wires in the programmable integrated circuit 12 corresponding to the zero value such that the respective calculation may be ignored or not performed.

The computing engine 16 may then program (process block 160) the circuitry and/or netlist to a programmable integrated circuit, such as the programmable integrated circuit 12. For example, the computing engine 16 may connect and/or disconnect components of the programmable integrated circuit 12 based on the design in the netlist, which may be part of the configuration 24, in the programmable integrated circuit 12. Because, in some embodiments, the redundant portion of the input learned parameter system may be converted to the circuitry and/or netlist once, as compared to multiple times in the case of the input learned parameter system, the circuitry and/or netlist may be reduced in size.

The computing engine 16 may then execute (process block 162) the circuitry and/or netlist implementing the less redundant learned parameter system instead of the input learned parameter system. For example, when applied to a CNN, the computing engine 16 may convolve a set of input feature maps 42 using the netlist. That is, as illustrated in the examples shown in FIGS. 7-9, the circuitry and/or netlist may include the transposed weights 112, 136, and the computing engine 16 may generate the output values 118 by computing the partial terms 144 of the output values 118 using the transposed weights 112, 136.

Using CNN as an example, the output of convolving the set of input feature maps may be the same between using the input learned parameter system and the less redundant learned parameter system, while redundancies in the less redundant learned parameter system have been reduced. In particular, the computing engine 16 may execute the circuitry and/or netlist implementing the less redundant learned parameter system, and not, for example, circuitry and/or netlist implementing the input learned parameter system. Because the less redundant learned parameter system reduces at least some redundancies that remain in the input redundant learned parameter system, the less redundant learned parameter system may be more efficient than the input learned parameter system. In this manner, redundancy in implementing CNNs may be decreased, resulting in decreased processing time, memory space usage, reduced power consumption and greater efficiency.

Moreover, the circuitry and/or netlist may configure the programmable integrated circuit 12 to ignore or not perform a respective calculation associated with or corresponding to a zero value in a (less redundant) learned parameter. For example, the circuitry and/or netlist may not connect one or more wires in the programmable integrated circuit 12 corresponding to the zero value such that the respective calculation may be ignored or not performed. As such, the programmable integrated circuit 12 programmed with the less redundant learned parameter system may have less connections and be more efficient than a programmable integrated circuit programmed with a learned parameter system in which redundancies have not been reduced as discussed above.

It should be understood that the method 150 is only one example embodiment of the present disclosure, and that any suitable use or application of reducing at least some redundancies and/or unnecessary operations using instance specific parameter values of a learned parameter system to generate a less redundant set of learned parameters and a corresponding less redundant learned parameter system is contemplated. For example, the less redundant learned parameter system may be applied to fields of video recognition, recommender systems, natural language processing, and the like, instead of simply image recognition.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A computing system for implementing a trained learned parameter system on a programmable integrated circuit, the computing system comprising:
the programmable integrated circuit; and
a computing engine configured to:
receive an input set of trained learned parameters for an input trained learned parameter system, wherein the input set of trained learned parameters comprises stable use instances;
reduce one or more redundancies in the input set of trained learned parameters to generate a less redundant set of trained learned parameters of a less redundant trained learned parameter system;
generate a netlist based on the less redundant trained learned parameter system;
program the netlist to the programmable integrated circuit; and
execute the netlist implementing the less redundant trained learned parameter system instead of the input trained learned parameter system.

2. The computing system of claim 1, wherein the computing engine is configured to apply the less redundant trained learned parameter system instead of the input trained learned parameter system to a set of input feature maps using the netlist.

3. The computing system of claim 1, wherein the computing engine is configured to transform a set of values of each trained learned parameter of the input set of trained learned parameters into a set of scaled ternary numbers.

4. The computing system of claim 1, wherein each value of each trained learned parameter of the input set of trained learned parameters comprises a positive or negative value.

5. The computing system of claim 1, wherein each trained learned parameter of the input set of trained learned parameters comprises integer values.

6. The computing system of claim 1, wherein each trained learned parameter of the input set of trained learned parameters comprises floating point values.

7. The computing system of claim 1, wherein each trained learned parameter of the input set of trained learned parameters is a binary trained learned parameter comprising one of two possible arbitrary values.

8. The computing system of claim 1, wherein each trained learned parameter of the input set of trained learned parameters is a ternary trained learned parameter comprising one of three possible arbitrary values.

9. The computing system of claim 1, wherein the one or more redundancies comprise one or more shared values between a set of trained learned parameters of the input set of trained learned parameters and at least one other set of trained learned parameters of the input set of trained learned parameters.

10. The computing system of claim 9, wherein the set of trained learned parameter and the at least one other set of trained learned parameters operate on a same input feature map.

11. The computing system of claim 9, wherein the computing engine is configured to generate the netlist using one instance of the one or more shared values.

12. The computing system of claim 1, wherein the computing engine is configured to execute the netlist implementing the less redundant trained learned parameter system by not performing one or more calculations associated with a trained learned parameter of the input set of trained learned parameters, wherein the trained learned parameter comprises a zero value.

13. The computing system of claim 1, wherein the computing engine is configured to execute the netlist implementing the less redundant trained learned parameter system by not connecting one or more wires in the programmable integrated circuit associated with a trained learned parameter of the input set of trained learned parameters, wherein the trained learned parameter comprises a zero value.

14. The computing system of claim 1, wherein at least one less redundant trained learned parameter of the less redundant set of trained learned parameters comprises fewer values than a corresponding trained learned parameter of the input set of trained learned parameters.

15. A method for implementing a trained learned parameter system on a programmable integrated circuit, the method comprising:
receiving, via a computing engine, an input set of trained learned parameters for a trained input learned parameter system, wherein the input set of trained learned parameters comprises stable use instances;
reducing, via the computing engine, one or more redundancies in the input set of trained learned parameters to generate a less redundant set of trained learned parameters of a less redundant trained learned parameter system;
generating, via the computing engine, a netlist based on the less redundant trained learned parameter system;
programming, via the computing engine, the programmable integrated circuit using the netlist; and
executing, via the computing engine, the netlist implementing the less redundant trained learned parameter system instead of the input trained learned parameter system.

16. The method of claim 15, comprising transforming, via the computing engine, the input set of trained learned parameters to a different format.

17. The method of claim 15, comprising quantizing, via the computing engine, the input set of trained learned parameters to generate a quantized input set of trained learned parameters.

18. The method of claim 17, wherein reducing, via the computing engine, the one or more redundancies in the input set of trained learned parameters comprises reducing, via the computing engine, the one or more redundancies in the quantized input set of trained learned parameters to generate the less redundant set of trained learned parameters of the less redundant trained learned parameter system.

19. Programming a circuit design comprising a trained learned parameter system in a programmable integrated circuit system to enable the programmable integrated circuit system to receive at least one input feature map and convolve the at least one input feature map with a set of weights of the trained learned parameter system to generate at least one output feature map, wherein the programmable integrated circuit system comprises:

first circuitry configured to:
  receive an input set of trained learned parameters for an input trained learned parameter system, wherein the input set of trained learned parameters comprises stable use instances;
  reduce one or more redundancies in the input set of trained learned parameters to generate a less redundant set of trained learned parameters of a less redundant trained learned parameter system; and
  generate a netlist based on the less redundant trained learned parameter system; and
second circuitry configured to execute the netlist implementing the less redundant trained learned parameter system instead of the input trained learned parameter system.

20. The programmable integrated circuit system of claim 19, wherein the input trained learned parameter system and the less redundant trained learned parameter system comprise convolutional neural networks.

21. The programmable integrated circuit system of claim 19, wherein the programmable integrated circuit comprises a field programmable gate array.

\* \* \* \* \*